United States Patent [19]
Wedel

[11] Patent Number: 5,706,300
[45] Date of Patent: Jan. 6, 1998

[54] TESTING DEVICE FOR INTERFACES

[75] Inventor: Matthias Wedel, Nuremberg, Germany

[73] Assignee: Siemens Aktiengesellschaft, Munich, Germany

[21] Appl. No.: 433,199

[22] Filed: May 2, 1995

[30] Foreign Application Priority Data

May 3, 1994 [DE] Germany .................. 44 15 398.8

[51] Int. Cl.$^6$ .................................................. G01R 31/00
[52] U.S. Cl. ........................... 371/22.1; 395/200.01; 395/200.13; 395/280; 395/821
[58] Field of Search ........................ 364/514 B, 550, 364/551; 371/22.1; 395/200.01, 200.13, 280, 821

[56] References Cited

U.S. PATENT DOCUMENTS

| | | | |
|---|---|---|---|
| 4,525,802 | 7/1985 | Hackamack | 364/900 |
| 4,752,825 | 6/1988 | Buckley et al. | 358/139 |
| 4,807,161 | 2/1989 | Comfort et al. | 364/550 |
| 4,975,602 | 12/1990 | Nhu | 307/475 |
| 5,457,694 | 10/1995 | Smith | 371/20.1 |
| 5,477,475 | 12/1995 | Sample et al. | 364/578 |
| 5,504,689 | 4/1996 | Fiebrich et al. | 364/481 |
| 5,506,850 | 4/1996 | Osann, Jr. | 371/22.1 |

FOREIGN PATENT DOCUMENTS 39 33 222  4/1991  Germany .

OTHER PUBLICATIONS

W. Murrman, Elektronik, "Logikanalysatorzusatz für PCs", 8/16.4 (1987), pp. 106–108.

Zeitschrift Elektronik Informationen, "Testgerät und Simulator für seriellen Datenbus," No. 4 (1981), p. 261.

T. Nygaard, et al., Elektronik, "Bus Analyzer: einer statt fünf, Modul–Konzept diagnostiziert am VMEbus, VSB, SCSI, VXI und Futurebus+," No. 21 (1992), pp. 51–56.

*Primary Examiner*—Ellis B. Ramirez
*Assistant Examiner*—Patrick Assouad

[57] ABSTRACT

An interface testing apparatus, comprising: a unit having a flexible logic module that is reconfigurable to evaluate data and control signals; connectors operatively configured to connect the unit to data and control buses at an interface between two other components coupled to and they communicate the data and control signals over the data and control buses; level connectors operatively coupled between the connectors and the unit to condition the data and control signals; memory modules operatively coupled to the unit; a reset logic unit operatively coupled to the unit; and a computer operatively coupled to the unit such that the flexible logic unit can be reconfigured by the computer as required for a given test and to receive from the unit results from a given test.

13 Claims, 2 Drawing Sheets

TESTING DEVICE FOR INTERFACES

BACKGROUND OF THE INVENTION

The present invention is directed to devices for testing data and control bus interfaces between components. Such testing devices serve to display commands that components exchange with one another.

In the periodical Elektronik, No. 8, Apr. 16, 1987, pp. 106–108, there is disclosed a logic analyzer for personal computers (PCs) wherein data are sampled and stored. The data are transmitted to a PC for further processing. Electrical signals can be reproduced on a monitor of the PC by the logic analyzer, in a manner similar to that performed by an oscilloscope. The interpretation of the displayed signals is undertaken by the user.

In German patent document No. DE-A-39 33 222, there is disclosed a measuring instrument that is composed of individual measuring modules and other display means. The individual measuring modules have different functions which can be selectively employed. A program employed to control the measuring modules is stored in a PC.

In the periodical Elektronik, 21/1992, there is disclosed a bus analyzer as a specific logic analyzer. Logic analysis is limited to the analysis of specific trigger functions.

In a product information portion of the periodical *Elektronik Informationen*, No. 4, 1981, p. 261, there is described a specific testing device and simulator for a data bus that can be reprogrammed interactively. The data can be displayed via a built-in video screen. An internal simulator having a separate memory for the simulation of programs is activatable. However, check of the image data, an evaluation of the transmitted commands or even simulation of individual devices, as well as simple matching of different evaluation functions, however, cannot be undertaken with such a testing device.

SUMMARY OF THE INVENTION

An object of the present invention is to provide a testing device or apparatus that enables simple yet easily variable testing of interfaces between two components, e.g., an imaging system and a camera unit of an X-ray diagnostics installation.

To that end, in an embodiment, the invention provides a testing device with a circuit configuration that comprises suitable connectors for coupling the circuit to data and control buses extending between the components, a flexible logic module which can be configured to conduct evaluations or analyses of signals appearing on the data and control buses, level converters operatively interopposed between the connectors and the flexible logic module to condition the signals as appropriate for use by the flexible logic module, memory devices operatively coupled to the flexible logic module, a reset logic unit operatively coupled to the flexible logic module, a serial port interface coupled to the flexible logic module and a computer operatively coupled to the serial port interface.

It can be appreciated that the flexible logic module can be configured under the control of the computer with test modules appropriate for a given application. Thus, a simple testing device that can be operated with a personal computer is obtainable. Such testing device would contain specific hardware for the evaluation of the image data interface and of the interface for the control instructions, and these can be loaded, respectively, with the appropriate upgrading and evaluation software.

Moreover, whereas the actual image data is evaluated or generated in the circuit configuration, the monitoring and command data are processed in the computer. The necessary two data streams are exchanged between the circuit and the computer in a common data stream.

It can further be appreciated that the circuit need not have processors (other than those in the computer) whatsoever. The evaluations are undertaken exclusively in the hardware of the flexible logic module. Preferably, this module is a loadable, programmable gate array, which is referred to as a Flexible Logic Element matrix (FLEX).

The above described testing device advantageously can be utilized in an X-ray diagnostics installation where it would be inserted between an imaging system and a camera unit to check the interface between them, the signals or instructions from both the imaging system as well as the camera unit bring evaluated by the testing device.

It is also advantageous to be able to switch the testing device between a plurality of modes, whereby a check of the interface instructions or signals exchanged between the imaging system and camera unit is undertaken in a first mode, the testing device simulates an imaging system in the second mode, and the testing device simulates a camera unit in a third mode.

These and other features and aspects of the invention will become clear in the following detailed description of the presently preferred embodiments with reference to the accompanying drawings.

DETAILED DESCRIPTION OF THE PRESENTLY PREFERRED EMBODIMENTS

Figure 1:
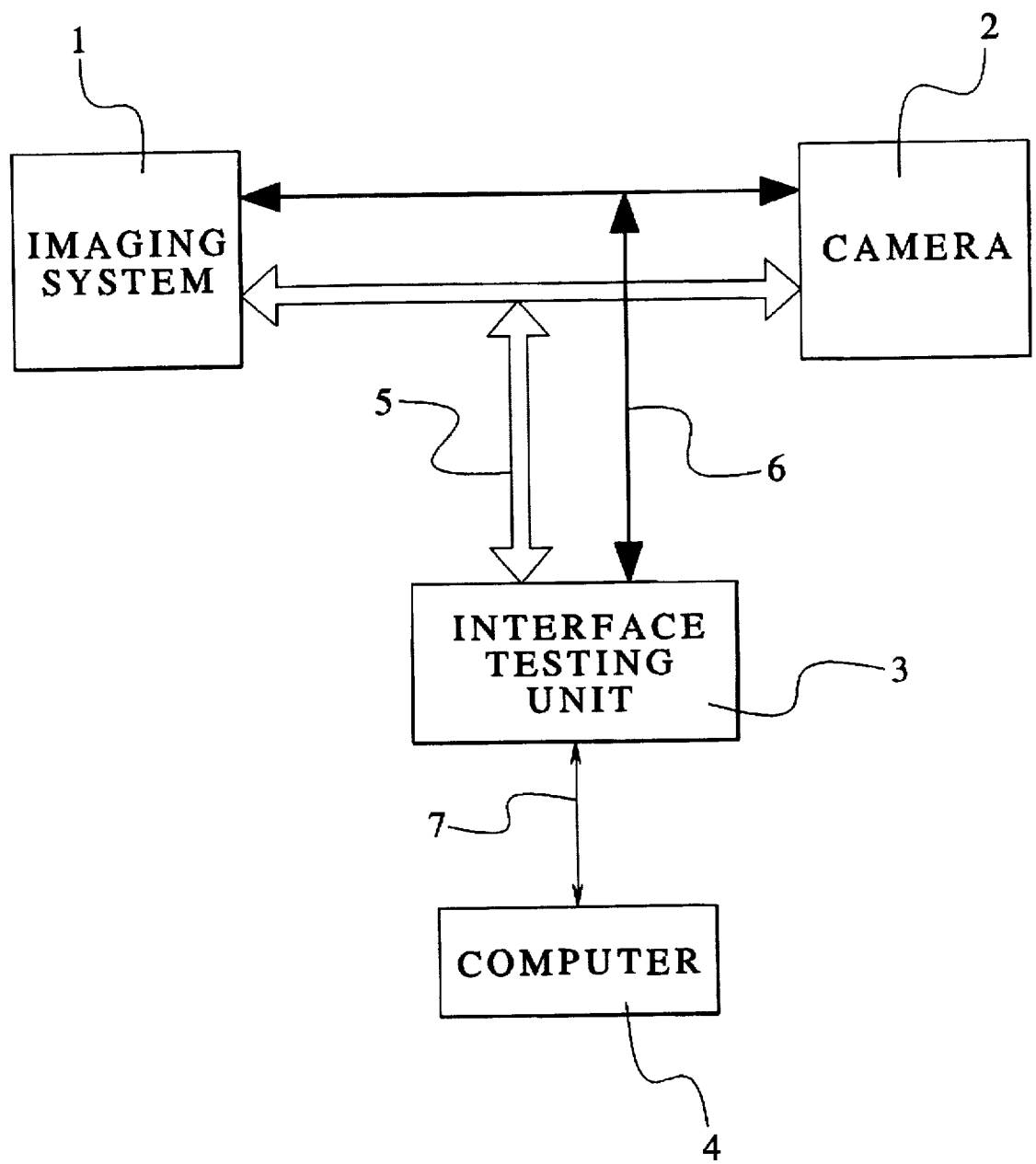
FIG. 1 illustrates use of a testing device embodying principles of the invention in an X-ray diagnostics installation.

In FIG. 1, there is illustrated an imaging system 1 and a camera unit 2 of an X-ray diagnostics installation. A testing device for the imaging system 1 and the camera 2, which comprises a circuit 3 and a computer 4, is also illustrated. The circuit 3 is connected to a data bus 5 and a control bus 6 that interconnect the system 1 and the camera unit 2. The circuit 3 is connected to the computer 4 via a connecting cable 7.

Figure 2:
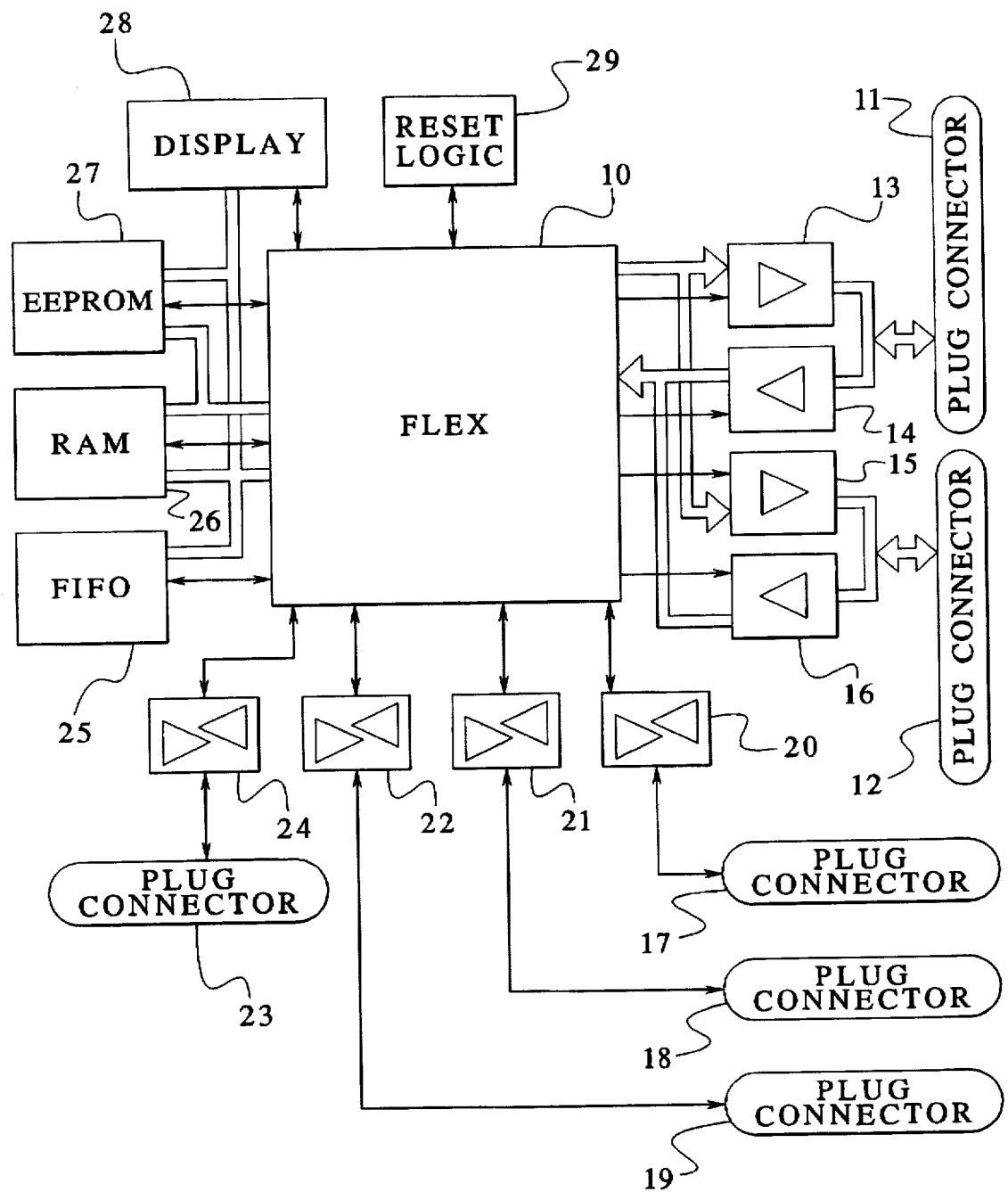
FIG. 2 illustrates a circuit diagram for the device of FIG. 1.

FIG. 2 illustrates in greater detail the structure of the configuration of the circuit 3 by way of a block diagram.

As illustrated, the main component of the circuit 3 is a unit or module 10 with flexible logic, preferably a module having a "Flexible Logic Element matriX" (FLEX). Like gate arrays, such modules contain a digital circuit that can be redefined or reconfigured by a user. In contrast to gate arrays, wherein the circuitry is permanently programmed, the circuit in a FLEX module can be reprogrammed on demand. Thus, essentially, different hardware can be loaded into the circuit 3 of the testing device depending upon the test to be implemented.

In FIG. 2 it is further illustrated that the circuit 3 is connected to the data bus 5 both from the imaging system 1 as well as the camera unit 2 via a plug connectors 11 and 12. Level converters 13, 14, 15 and 16, for example RS485 drivers that match the level of RS485 interfaces to the internal TTL level, are operatively interposed between the connectors 11 and 12 and the module 10. The data signals received via the connectors 11 and 12 are conducted to the module 10 or, respectively, the image data generated or forwarded by the module 10 are conducted to the camera unit 2 via these level converters.

The control bus 6 is connected to the module 10 via further plug connections 17, 18 and 19, either directly or indirectly via further level converters 20, 21 and 22. These lateral level converters 20–22 preferably comprise RS232 drivers that match the level of RS232 interfaces to the internal TTL level.

The computer 4 and the flex module 10 communicate with each other via yet another plug connector 23 with an associated level converter 24, the plug connector 23 and level converter 24 providing a serial port interface between the module 10 and the computer 4.

As also illustrated, memory means or devices 25, 26 and 27 are connected to the module 10. These memory devices 25–27 can be composed of a FIFO memory 25 that intermediately stores data for a short time when the computer 4 is busy and does not accept any data via the serial interface, a RAM memory 26 in which data from the module 10 can be intermediately stored or into which programs can also be loaded, and an EEPROM memory 27 in which a plurality of selectable hardware modules for the module 10 can be programmed.

A display 28 also is provided. For example, appropriate status displays can be produced on the display 28.

A reset logic circuit or unit 29 is provided and connected to the module 10 as illustrated. The reset logic 29 preferably acts as a starter and serves for commencing loading of the module 10. In that regard, the circuit 3 is reset given a suitable activation of the reset logic 29, but can also be restarted via an appropriate key (not shown). Such a reset always leads to a renewed loading of the hardware that is effected and controlled by the reset logic 29. It is assured via external logic that loading is from EEPROM memory 27.

The module 10 is itself reconfigured after a RESET. The necessary hardware information is loaded from the EEPROM 27 via appropriate address and data lines connected between the EEPROM 27 and the flex module 10. To that end, the circuit 3 first loads the basic module itself. In particular, this basic module permits starting of other test modules. Over and above this, the EEPROM 27 can also be erased and rewritten through the use of the basic module. Subsequently, a desired test module is loaded, so that the circuit 3 takes on the new functionality required for a given test.

Preferably, the circuit 3 can assume different modes. In a given mode, the device 3 undertakes certain tests appropriate for that mode while in another mode or in other modes, other tests may be undertaken. Three such modes are discussed next.

In a first mode, the testing device checks the interface for the image data that the imaging system 1 supplies to the camera unit 2 via the data bus 5 and also checks the control instructions that the imaging system 1 and the camera unit 2 exchange with each other via the control bus 6. Errors that occur are recognized and subsequently logged on the computer by the computer 4.

In a second mode, the circuit 3 of the testing device can be made to simulate a camera unit 2. In this mode, the circuit receives the image data from the imaging system 1 but does not evaluate the data. Rather, the circuit 3 checks the transmission of the data. However, the circuit 3 can transmit simulated errors via the data bus and the control bus 6 that should be recognized by the imaging system 1.

In a third mode, the circuit 3 simulates the imaging system 1. In this mode, the circuit 3 transmits test images to the camera unit 2 at various resolutions. Error conditions can be simulated and the behavior of the camera unit 2 checked.

For these various modes, the FLEX module 10 is loaded with the requisite test modules from the EEPROM memory 27 in response to commands issued from the computer 4.

As discussed above, there is a serial interface between the circuit 3 and the computer 4. All information preferably is exchanged with the circuit 3 via the connector 23 of this interface. The control data and the evaluation of the image data are transmitted over this interface interleaved by multiplexing. This is possible because the interfaces for the control data work substantially more slowly than the interface to the computer 4.

It can be appreciated that this configuration of a testing device yields a circuit arrangement for acquiring the data that can be easily adapted according to the desires and demands of the system and can be operated in a simple way with an IBM-compatible personal computer with appropriate operating and evaluation software. The testing device contains specific hardware for the evaluation of the image data interface the interface for the control instructions.

Although modifications and changes may be suggested by those skilled in the art, it is the intention of the inventors to embody within the patent warranted hereon all changes and modifications as reasonably and properly come within the scope of their contribution to the art.

I claim:

1. An interface testing apparatus, comprising:
   a unit having a flexible logic module that is reconfigurable to evaluate data and control signals;
   connectors operatively configured to connect the unit to data and control buses at an interface between two other components coupled thereto and that communicate the data and control signals over the data and control buses;
   level connectors operatively coupled between the connectors and the unit to condition the data and control signals;
   memory modules operatively coupled to the unit;
   a reset logic unit operatively coupled to the unit; and
   a computer operatively coupled to the unit such that the flexible logic module can be reconfigured by the computer as required to effect a test of the interface and to receive from the unit results from the test.

2. The apparatus of claim 1, wherein the unit is configured to be switched between a plurality of modes.

3. The apparatus of claim 1, wherein the two components are an imaging system and a camera of an X-ray diagnostics system.

4. The apparatus of claim 3, wherein the unit is configured to check signals from both the imaging system as well as the camera unit of the X-ray diagnostics system.

5. The apparatus of claim 3, wherein the unit can be switched between a plurality of modes, and in one of the modes, the unit simulates reactions of the camera unit to control and data signals transmitted from the imaging system.

6. The apparatus of claim 3 wherein the unit can be switched between a plurality of modes, and in one of the modes, the unit monitors interface instructions communicated between the camera unit and the imaging system.

7. The apparatus of claim 3, wherein the unit can be switched between a plurality of modes, and in one of the modes, the unit simulates the imaging system.

8. An apparatus for testing a data and control bus interface between an imaging system and a camera unit in an X-ray diagnostics system, comprising:

connectors for coupling the apparatus to the data and control buses;

a flexible logic module configurable for conducting a test of the interface;

level converters operatively interposed between the connectors and the flexible logic module to condition data and control signals exchanged between the flexible logic module and the first connectors;

memory devices operatively coupled to the flexible logic module;

a serial interface operatively connected to the flexible logic module;

a computer operatively coupled to the serial interface in such a manner that the computer can control the configuration of the flexible logic module to effect such testing of the data and control bus interface and receive data from the flexible logic module as it conducts the test of the interface.

9. The apparatus of claim 8, wherein the module is configured to check signals from both the imaging system as well as the camera unit of the X-ray diagnostics system.

10. The apparatus of claim 8, wherein the module is configured to be switched between a plurality of modes.

11. The apparatus of claim 10, wherein in one of the modes, the module simulates reactions of the camera unit to control and data signals transmitted from the imaging system.

12. The apparatus of claim 10, wherein in one of the modes, the module simulates the imaging system.

13. The apparatus of claim 10 wherein in one of the modes the module monitor instructions exchanged between the camera unit and the imaging system simulates the camera unit.

* * * * *